(12) United States Patent
Zellner et al.

(10) Patent No.: US 7,999,917 B2
(45) Date of Patent: Aug. 16, 2011

(54) ILLUMINATION SYSTEM AND MICROLITHOGRAPHIC PROJECTION EXPOSURE APPARATUS INCLUDING SAME

(75) Inventors: Johannes Zellner, Aalen (DE); Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 430 days.

(21) Appl. No.: 12/171,596

(22) Filed: Jul. 11, 2008

(65) Prior Publication Data
US 2009/0021713 A1 Jan. 22, 2009

Related U.S. Application Data

(60) Provisional application No. 60/950,153, filed on Jul. 17, 2007.

(30) Foreign Application Priority Data

Jul. 17, 2007 (DE) .......................... 10 2007 033 603

(51) Int. Cl.
*G03B 27/54* (2006.01)
(52) U.S. Cl. ....................................... 355/67
(58) Field of Classification Search .................... 355/53, 355/67; 359/733
See application file for complete search history.

(56) References Cited

U.S. PATENT DOCUMENTS

| | | | |
|---|---|---|---|
| 6,353,470 B1 | 3/2002 | Dinger | |
| 6,452,661 B1 * | 9/2002 | Komatsuda | 355/67 |
| 6,660,552 B2 | 12/2003 | Payne et al. | |
| 6,710,917 B2 | 3/2004 | Mann et al. | |
| 6,902,283 B2 | 6/2005 | Dinger | |
| 6,922,291 B2 | 7/2005 | Sunaga et al. | |
| 6,947,210 B2 | 9/2005 | Terasawa | |
| 7,023,523 B2 | 4/2006 | Komatsuda | |
| 7,070,289 B2 | 7/2006 | Sasaki et al. | |
| 7,114,818 B2 | 10/2006 | Minakata | |
| 7,186,983 B2 | 3/2007 | Mann et al. | |

(Continued)

FOREIGN PATENT DOCUMENTS

DE 102 12 405 10/2002

(Continued)

OTHER PUBLICATIONS

Bal, Matthieu Frédéric, dissertation "Next-Generation Extreme Ultraviolet Lithographic Projection Systems", pp. 1-139, (Feb. 10, 2003).

(Continued)

*Primary Examiner* — Edward Glick
*Assistant Examiner* — Deoram Persaud
(74) *Attorney, Agent, or Firm* — Fish & Richardson P.C.

(57) ABSTRACT

The disclosure relates an illumination system configured to guide illumination light from a radiation source to an object plane and to provide defined illumination of an object field in the object plane, wherein illumination light is supplied to the object field by a bundle-guiding optical pupil component which is disposed in a pupil plane of the projection objective, and wherein at least another bundle-guiding component is disposed upstream of the pupil component in the beam path of the illumination light. The disclosure further concerns a projection exposure apparatus that includes such an illumination system of this type, a method of fabricating a microstructured component using such a projection exposure apparatus, and a microstructured component fabricated using such a method.

20 Claims, 4 Drawing Sheets

U.S. PATENT DOCUMENTS

| | | | |
|---|---|---|---|
| 2001/0002155 A1* | 5/2001 | Takahashi et al. | 359/858 |
| 2002/0154395 A1* | 10/2002 | Mann et al. | 359/364 |
| 2004/0013956 A1* | 1/2004 | Sogard | 430/30 |
| 2004/0189968 A1 | 9/2004 | Terasawa | |
| 2005/0002090 A1 | 1/2005 | Singer et al. | |
| 2005/0264789 A1* | 12/2005 | Komatsuda | 355/67 |
| 2007/0058269 A1 | 3/2007 | Mann et al. | |
| 2007/0120072 A1 | 5/2007 | Mann et al. | |
| 2007/0223112 A1 | 9/2007 | Mann et al. | |

FOREIGN PATENT DOCUMENTS

| | | |
|---|---|---|
| DE | 103 59 576 | 7/2005 |
| EP | 1 333 260 A2 | 8/2003 |
| EP | 1 335 228 A1 | 8/2003 |
| EP | 1 434 093 | 6/2004 |
| JP | 2002-139672 | 5/2002 |
| JP | 2003-222572 | 8/2003 |
| JP | 2003-233002 | 8/2003 |
| JP | 2004-029625 | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2005-055553 | 3/2005 |
| WO | WO 02/27400 | 4/2002 |
| WO | WO 02/48796 | 6/2002 |
| WO | WO 02/056114 | 7/2002 |
| WO | WO 2004/010224 | 1/2004 |
| WO | WO 2006/119977 | 11/2006 |

OTHER PUBLICATIONS

Office Action for corresponding Application No. JP 2008-529565, dated Dec. 7, 2009.

English translation of Office Action for corresponding Application No. JP 2008-529565, dated Feb. 21, 2011.

* cited by examiner

ILLUMINATION SYSTEM AND MICROLITHOGRAPHIC PROJECTION EXPOSURE APPARATUS INCLUDING SAME

CROSS-REFERENCE TO RELATED APPLICATIONS

This application claims priority under 35 U.S.C. §119(e)(1) to U.S. Provisional Application No. 60/950,153 filed Jul. 17, 2007. This applications also claims priority under 35 U.S.C. §119 to German Patent Application DE 10 2007 033 603.0, filed Jul. 17, 2007. The contents of both of these applications are hereby incorporated by reference.

FIELD

The disclosure relates an illumination system configured to guide illumination light from a radiation source to an object plane and to provide defined illumination of an object field in the object plane, wherein illumination light is supplied to the object field by a bundle-guiding optical pupil component which is disposed in a pupil plane of the projection objective, and wherein at least another bundle-guiding component is disposed upstream of the pupil component in the beam path of the illumination light. The disclosure further concerns a projection exposure apparatus that includes such an illumination system of this type, a method of fabricating a microstructured component using such a projection exposure apparatus, and a microstructured component fabricated using such a method.

BACKGROUND

An illumination system and a projection exposure apparatus equipped therewith are known.

SUMMARY

In certain embodiments, the disclosure provides an illumination system having a compact arrangement of optical components.

In some embodiments, the disclosure provides an illumination system configured to guide illumination light from a radiation source to an object plane and to illuminate an object field in the object plane in a defined manner, wherein illumination light is supplied to the object field by a bundle-guiding optical pupil component that is disposed in a pupil plane of the projection objective, and wherein at least another bundle-guiding component is disposed upstream of the pupil component in the beam path of the illumination light, the bundle-guiding component guiding bundles of the illumination light in the illumination system such that the beam path impinging on the last bundle-guiding component upstream of the pupil component intersects the beam path between the pupil component and the object field.

In certain embodiments, the disclosure provides a microlithographic projection exposure apparatus that includes a projection objective configured to image an object field in an object plane into an image field in an image plane, and an illumination system. Illumination light is supplied to the object field by a bundle-guiding optical supply component that is disposed in a pupil plane of the projection objective, wherein at least another bundle-guiding component is disposed upstream of the supply component in the beam path of the illumination light, and wherein the at least another bundle-guiding component upstream of the supply component, when seen from the radiation source, lies beyond an optical axis of the projection objective along which the centers of curvature of optically active surfaces of the projection objective are situated.

Guiding the bundles along the beam path of the illumination light in the illumination system such that the bundles intersect at a very late stage can enable a very compact arrangement of the last optical components of the illumination system to be achieved upstream of the object field. In particular optical components of the illumination system may be disposed very closely to components of a projection objective disposed downstream thereof so as to use the free space that may be available there.

Supplying the illumination light via the pupil component can reduce the number of reflections involved to guide the illumination light, thus obtaining a more compact illumination system on the one hand while on the other hand reducing reflection losses.

By arranging the additional bundle-guiding component, the available space in the vicinity of the projection objective can be used more efficiently, helping to ensure that even in the event of larger bundle cross-sections, the bundles on the individual reflective components may be separated from one another in a good manner.

There are two exemplary ways of supplying the illumination light from the pupil component to the object field. In some embodiments, the pupil component may be disposed such that the illumination light is directly supplied to the object field by the pupil component. This can involve only a low number of reflections. In certain embodiments, at least one mirror may be disposed in the beam path of the illumination light between the pupil component and the object field, the mirror being a grazing incidence mirror for grazing incidence at an angle of incidence greater than or equal to 60°. A mirror of this type may be used for deflection or also for field formation, for example.

A last bundle-guiding component disposed upstream of the supply component in the projection exposure apparatus can allow the components near the source of the illumination system to be moved closer to the optical axis, and therefore closer to the projection objective. Consequently, a desired compact optical arrangement of the projection exposure apparatus is obtained.

The supply component may be a pupil component that is disposed in a pupil plane of the projection objective of the projection exposure apparatus. An arrangement of this type can be compact in design, which can help ensure good control of the illumination angles used to illuminate the object field.

The advantages of a microlithographic projection exposure apparatus that includes a projection objective for imaging an object field in an object plane into an image field in an image plane and an illumination system can be as discussed above in relation to the illumination system.

The bundle-guiding components of the projection objective may be mirrors having optically active surfaces that may be described by rotationally symmetric functions, i.e. optically active spherical or aspherical surfaces. Optionally, at least some optically active surfaces of the projection objective may be designed as free-form surfaces, i.e. surfaces having a mathematical description without an axis of rotational symmetry. In that case, the position of the last bundle-guiding component by which the advantageous compact optical arrangement is obtained may be defined such that when seen from the radiation source, at least part of this last bundle-guiding component upstream of the pupil component lies beyond a plane that is perpendicular to a radiation-source/illumination-light main plane which is defined by the bundle-guiding components for the illumination light upstream of the last bundle-guiding component and which there is a connection line between the point of penetration of central chief rays of the illumination light passing through a reticle in the object plane on the one hand and through a wafer in the image plane on the other hand. The advantages of this position of the last bundle-guiding component can be as described above in relation to the projection exposure apparatus.

A projection exposure apparatus in which no optical component of the projection objective is disposed along the optical axis at least along a free length of more than 40% of the length of the projection objective can provide enough space for optical components of the illumination system. In some embodiments, a free length is more than 45% (e.g., more than 50%, more than 55%, more than 60%) of the length of the projection objective, i.e. of the distance between the object field and the image field.

It can be advantageous for the optical component closest to the optical axis at the height of the free length is spaced from the optical axis by a distance of more than 10% of the free length. Such a minimum distance provides a particular amount of space for arranging optical components of the illumination system. In some embodiments, the minimum distance is more than 15%, such as more than 20%, of the free length of the projection objective.

A projection objective including six mirrors between the object plane and the image plane, wherein the fourth mirror along the imaging beam path of the projection objective is convex, and a projection objective including six mirrors between the object plane and the image plane, wherein the third mirror along the imaging beam path of the projection objective is concave, can be particularly suitable in terms of creating a large amount of free space within the projection objective.

Simultaneously acting as a spectral filter, a coupling mirror upstream of the last bundle-guiding component of the illumination system can result in an even more compact optical arrangement of the projection exposure apparatus since one component fulfills two functions, i.e. spectral filtering on the one hand and coupling on the other.

In some embodiments, the disclosure provides methods of using the systems disclosed herein to prepare fabricated components. The methods can include, for example: providing a projection exposure apparatus; providing a reticle having a pattern to be imaged; imaging the pattern on the reticle onto an illumination-light sensitive layer of a wafer; and the advantages of a component fabricated using a method of this type. The advantages of methods can be equivalent to those described above in relation to the illumination system and the projection exposure apparatus.

BRIEF DESCRIPTION OF THE DRAWINGS

Embodiments will hereinafter be described in more detail in conjunction with the drawings, in which.

DETAILED DESCRIPTION

Figure 1:
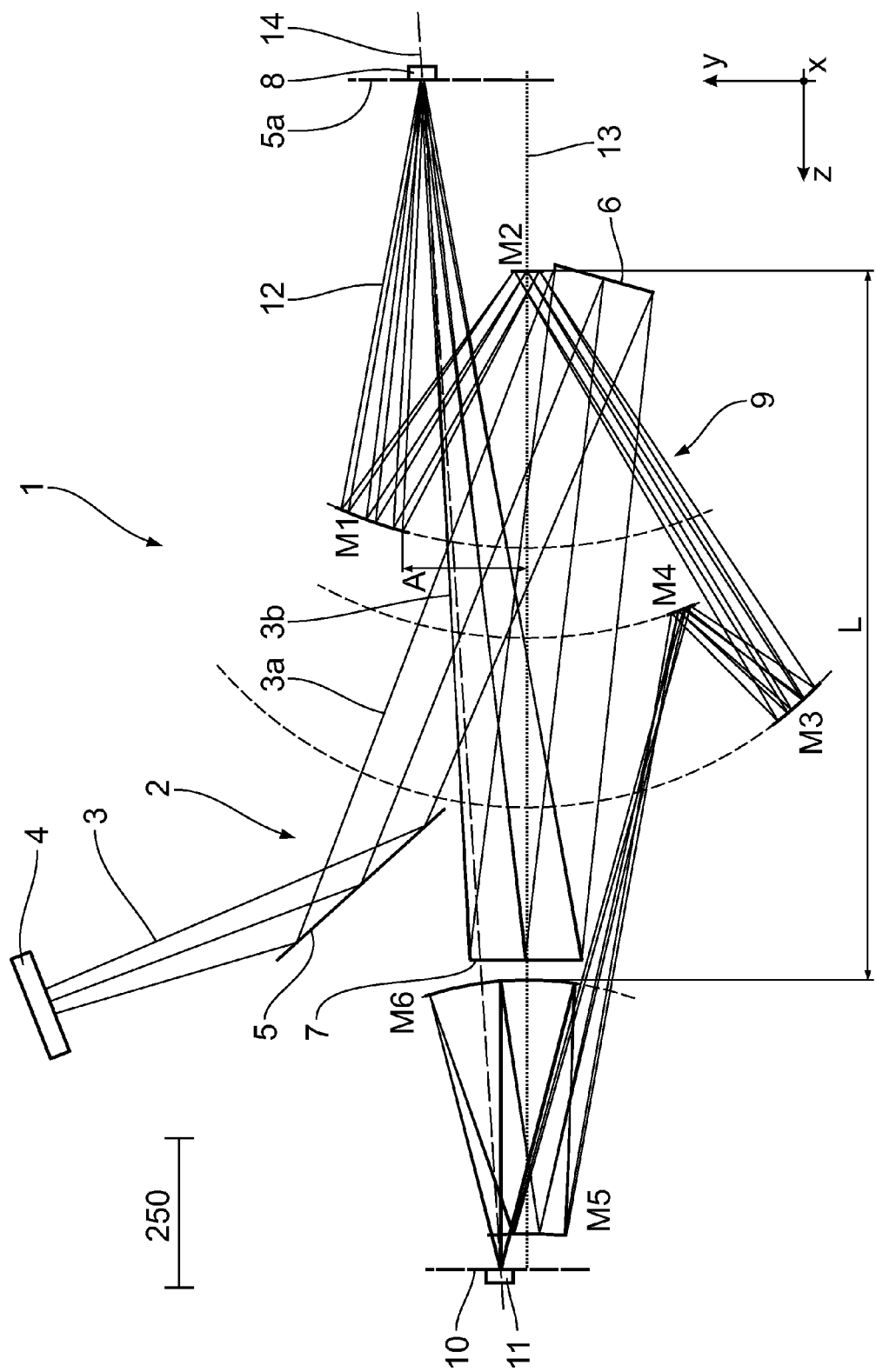
FIG. 1 shows a schematic view of the bundle-guiding components of a microlithographic EUV projection exposure apparatus that includes an illumination system and a projection objective.

A microlithographic projection exposure apparatus 1 shown schematically in FIG. 1 includes an illumination system 2 for guiding illumination light 3 from a radiation source 4 to an object plane 5a of the projection exposure apparatus 1. The illumination light 3 is schematically indicated by a few selected illuminating rays. The illumination light 3 can be EUV radiation in a wavelength range of between 10 nm and 30 nm.

The radiation source 4 is only indicated in FIG. 1. The radiation source 4 includes an EUV emitter, such as a discharge source or a plasma source. Moreover, the radiation source 4 includes a collector that initially focuses the illumination light 3 exiting the EUV emitter. The collector may be a nested grazing incidence collector. A collector of this type is for example disclosed in WO 02/27400 A2. The individual components of the radiation source 4 are well known and not shown in FIG. 1 but will be briefly explained below.

Downstream of the collector, the focused illumination light 3 may now at first impinge on a spectral filter of the radiation source 4. This spectral filter has the shape of a grating 5 that is impinged at a grazing angle of incidence. For instance, a zero or first order of diffraction of illumination light 3 is selected via the spectral filter. An intermediate focus is disposed downstream of the spectral filter, an aperture diaphragm of the radiation source 4 acting as a spatial filter at the position of the intermediate focus.

FIG. 1 shows the illumination light 3 downstream of this intermediate focus. Downstream of the radiation source 4 as far as described above, the illumination light 3 initially impinges on a coupling mirror 5 (shown as being combined with the spectral filter) which is a grazing incidence mirror. The illumination light 3 impinges on the coupling mirror 5 at an angle of incidence, i.e. at an angle relative to the surface normal of the mirror plane, that amounts to approximately 65°.

In some embodiments, the coupling mirror 5 and the spectral filter of the radiation source 4 may be one and the same component. In this case, only the coupling mirror 5 acting as spectral filter is disposed downstream of the radiation source including the collector. Optionally, however, the coupling mirror and spectral filter may be separate components.

Upon reflection at the coupling mirror 5, the illumination light 3 impinges on a field facet mirror 6. The angle of incidence of the illumination light 3 impinging on the field facet mirror 6 amounts to approximately 8°. Downstream of the field facet mirror 6, the illumination light 3 is reflected at a pupil facet mirror 7. The angle of incidence of the illumination light 3 impinging on the pupil facet mirror 7 amounts to approximately 6.5°.

The coupling mirror 5, the field facet mirror 6 and the pupil facet mirror 7 are components of the illumination system 2 which serves to guide the illumination light 3 from the radiation source 4 to the object plane 5a, and thus to illuminate an object field in the object plane 5a in a defined manner. A reflecting reticle 8 is disposed at the position of the object field, the reticle having a pattern to be imaged by the projection exposure apparatus 1.

Those skilled in the art distinguish between various embodiments of EUV illumination systems including field and pupil facet mirrors, disclosed for instance in WO 2004/010 224 A2, US 2005/0 002 090 A1 and WO 2006/119 977 A1. As also known through an illumination system disclosed in WO 2004/010 224 A2, the illumination light 3 is supplied from the pupil facet mirror 7 to the object field directly without any other deflection elements for the illumination light 3. In some embodiments, the pupil facet mirror 7 is a bundle-guiding optical pupil component that is disposed in an entrance pupil of a projection objective 9 serving to generate a demagnified image of the object field of the object plane 5a in an image field of an image plane 10. The projection objective 9 has a negative back focus of the entrance pupil. Chief rays of adjacent field points are reflected by the reticle 8 as divergent rays. At the reticle 8, a chief ray angle of a central field point amounts to 6.67°.

A maximum angle of incident rays of the illumination light 3 in the projection objective 9 occurs at the mirror M4, the angle amounting to 36°. The projection objective has a length of 2000 mm, corresponding to the distance between the object plane 5a and the image plane 10.

Guiding of bundles of illumination light 3 between the coupling mirror 5 and the object plane 5a is such that a bundle portion 3a between the coupling mirror 5 and the field facet mirror 6 intersects a bundle portion 3b between the pupil facet mirror 7 and the reticle 8, the bundle portion 3a being the bundle portion impinging on the field facet mirror 6, i.e. on the last bundle-guiding component upstream of the pupil facet mirror 7.

A wafer 11 is disposed in the image plane 10 in the vicinity of the image field, the wafer 11 being equipped with a layer sensitive for illumination light 3 on the surface impinged by illumination light 3.

The projection objective 9 has a total of 6 mirrors which are referred to by M1 to M6 in FIG. 1, corresponding to their order of arrangement in an imaging beam path 12 of the illumination light 3. The mirrors M1 to M6 have a common optical axis 13 along which are situated the centers of curvature of the curved mirrors of the projection optics 9, i.e. the optically active surfaces thereof.

The following is a specification of distances of the mirrors M1 to M6 from the optical axis 13. Each of these distances is defined as the shortest distance of the optically used surface of the mirrors M1 to M6 from the optical axis 13.

The mirror M1 is concave and is spaced from the optical axis 13 by a distance of 216 mm. The chief rays of the imaging beam path 12 impinge on the mirror M1 at an angle of incidence of 12.6°. The mirror M2 is almost plane and is disposed centrally on the optical axis 13. The chief rays of the imaging beam path 12 impinge on the mirror M2 at an angle of incidence of 32.0°. The mirror M2 is disposed in the vicinity of a pupil plane of the projection objective 9. The mirror M3 is concave and is spaced from the optical axis 13 by a distance of 432 mm. The chief rays of the imaging beam path 12 impinge on the mirror M3 at an angle of incidence of 9.3°. The mirror M4 is convex and spaced from the optical axis 13 by a distance of 248 mm. Chief rays of the imaging beam path 12 impinge on the mirror M4 at an angle of incidence of 31.6°. The mirror M5 is convex and disposed off-center of the optical axis 13 such that the optical axis 13 intersects the optically used area of the surface of the mirror M5. The chief rays of the imaging beam path 12 impinge on the mirror M5 at an angle of incidence of 10.7°. An intermediate image plane of the projection objective 9 is disposed between the mirrors M4, M5. The mirror M6 is concave. The mirror M6 is disposed off-center of the optical axis 13 such that the optical axis 13 intersects the optically used area of the surface of the mirror M6. The chief rays impinge on the mirror M6 at an angle of incidence of approximately 4.5°. Another pupil plane of the projection objective 9 is disposed between the mirrors M5 and M6. On the image side, the projection objective 9 has a numerical aperture of NA=0.25. The maximum field radius on the image side amounts to 44.7144 mm.

The quotient of incidence tangent and reflection tangent of the chief rays of illumination light 3 when reflected at one of the mirrors M1 to M6 is hereinafter referred to chief-beam enhancement. The incidence tangent is the tangent of the chief-ray angle impinging on the respective mirror relative to the optical axis 13 while the refraction tangent is the tangent of the chief-ray angle, relative to the optical axis 13, exiting the respective mirror upon reflection. The mirror M1 thus has a positive chief-ray enhancement. The mirror M2 has a negative chief-ray enhancement. Likewise, the mirrors M3 and M4 both have a negative chief-ray enhancement.

The projection objective 9 has a working wavelength of 13.5 nm. The projection objective 9 has a wavefront error rms of 52.3074 m$\lambda$ in relation to a wavelength $\lambda$ of 13.5 nm.

The mirror M6 and the pupil facet mirror 7 are disposed "back-to-back" along the optical axis 13, i.e. with their reflecting surfaces facing away from each other.

The field facet mirror 6 is disposed at the height of the mirror M2 at a distance of 41 mm from the optical axis. Seen from the radiation source 4, the field facet mirror 6, i.e. the last bundle-guiding component upstream of the pupil facet mirror 7 in the displayed meridional section, lies beyond the optical axis 13 of the projection objective 9.

In the vicinity of the optical axis 13, the projection objective 9 has a large free space. No optical component of the projection objective 9 is disposed on the optical axis 13 along a free length L between the mirrors M2 and M6 along the optical axis 13, this free length L of approximately 1150 mm amounting to more than 57% of the length of the entire projection objective 9. Depending on the design of the projection objective 9, this free length L may amount to more than 45%, to more than 50%, or even to more than 55% of the entire length L of the projection objective 9.

At the height of the free length L, the mirror M1 is closest to the optical axis 13. The mirror M1 is spaced from the optical axis 13 by a distance A of 204 mm, this distance thus amounting to more than 17% of the free length L of the projection objective 9. Depending on the design of the projection objective 9, the minimum distance A of an optical component at the height of the free length L may be more than 15%, more than 20%, or more than 25% of the free length L.

When fabricating a microstructured component, i.e. a highly integrated semiconductor component such as a memory chip, the projection exposure apparatus 1 is used as follows: First of all, the reticle 8 is provided such that the pattern to be imaged disposed thereon is placed in the object field in the object plane 5a. Subsequently, via the illumination light 3, this pattern on the reticle 8 is imaged on an illumination-light sensitive layer of the wafer 11 which is in turn provided in the image field in the image plane 10. The exposed structure may then be developed for fabrication of the microstructured component.

The reticle 8 and the wafer 11 are supported by support members not shown in detail. The projection exposure apparatus 1 may be a scanner or a stepper. If a scanner is used, the support members are continuously displaced during exposure. If a stepper is used, the support members are displaced in steps each time an exposure process is complete.

The Figure is provided with a Cartesian xyz-coordinate system so as to facilitate comprehension of the subsequent detailed description of the relative positions of optical components. The x-direction is perpendicular to the drawing plane, thus pointing towards the observer. The y-direction extends along the direction of displacement of the support members of the reticle 8 or the wafer 11, thus extending upwards in FIG. 1. The z-direction is perpendicular to the object plane 5a and to the image plane 10, thus extending towards the left of FIG. 1.

The mirrors M1 to M6 of the projection objective 9 need not necessarily be designed as spherical mirrors. These mirrors M1 to M6 or individual ones of these mirrors M1 to M6 may also be designed as asphericals or freeform surfaces, i.e. surfaces without axis of rotational symmetry of the optical surfaces. Freeform surfaces of this type are for instance described in US 2007 00058269 A1.

It can be difficult to clearly define an optical axis for a projection objective 9 due to the shape or the arrangement of the mirrors M1 to M6, respectively, the relative position of the field facet mirror 6 relative to the radiation source 4 may be defined as follows:

A separation plane 14 is defined as a plane that is perpendicular to the yz-plane, i.e. perpendicular to a radiation-source/illumination-light main plane that is defined by the bundle-guiding components 4, 5 for the illumination light 3 upstream of the field facet mirror 6 which is the last bundle-guiding component upstream of the pupil facet mirror 7. Moreover, the separation plane 14 is defined by connecting the points of penetration of central chief rays of the illumination light 3 when passing through the reticle 8 on the one hand and through the wafer 11 on the other. Via the separation plane 14, the space in which the projection exposure apparatus 1 including the illumination system 2 and the projection objective 9 are disposed, is divided into two half-spaces. The radiation source 4 is disposed in one of these half-spaces while the field facet mirror 6 is disposed in the second half-space.

The optical data of the illumination-light 3 guiding components of the EUV projection exposure apparatus 1 can be obtained from the following tables. Table 1 contains the radii of apex curvature (radius) of the individual components as well as their distance from the object plane (thickness).

TABLE 1

| Surface | Radius | Thickness | Mode of Operation |
| --- | --- | --- | --- |
| Object | INFINITY | 785.791 | |
| Mirror 1 | −788.555 | −464.945 | REFL |
| Mirror 2 | −592.859 | 900.265 | REFL |
| Mirror 3 | −682.462 | −284.514 | REFL |
| Mirror 4 | −501.243 | 1004.533 | REFL |
| Mirror 5 | 684.684 | −427.619 | REFL |
| Mirror 6 | 564.941 | 486.322 | REFL |
| Image | INFINITY | 0 | |

Table 2 contains the coefficients K and A to G defining the precise surface shape of the reflecting surfaces of the six mirrors M1 to M6.

TABLE 2

| Surface | K | A | B |
| --- | --- | --- | --- |
| Mirror 1 | −7.796949E−02 | 0.000000E+01 | −4.622470E−17 |
| Mirror 2 | −1.220071E+01 | 0.000000E+01 | 2.662948E−12 |
| Mirror 3 | −5.694170E−01 | 0.000000E+01 | −1.280811E−15 |
| Mirror 4 | −2.075589E+01 | 0.000000E+01 | −7.944739E−14 |
| Mirror 5 | 1.092099E+01 | 0.000000E+01 | −8.481743E−15 |
| Mirror 6 | 1.072736E−01 | 0.000000E+01 | 2.366426E−17 |

| Surface | C | D | E |
| --- | --- | --- | --- |
| Mirror 1 | 4.834365E−23 | −4.331473E−28 | 0.000000E+01 |
| Mirror 2 | 5.964933E−16 | 2.507548E−19 | 0.000000E+01 |
| Mirror 3 | 5.059481E−22 | 4.167311E−27 | −1.646570E−32 |
| Mirror 4 | 1.233938E−18 | −8.573306E−24 | 2.336358E−29 |
| Mirror 5 | −2.176907E−19 | 4.006891E−23 | 9.632774E−28 |
| Mirror 6 | 8.909249E−22 | −2.513599E−26 | 3.164160E−31 |

The sag z at the point having the distance h from the z-axis ($h^2 = x^2 + y^2$) is obtained by the following formula, the z-axis coinciding with the axis of rotational symmetry of the respective surface:

$$z = \frac{ch^2}{1 + SQRT\{1 - (1+k)c^2h^2\}} + Ah^4 + Bh^6 + Ch^8 + Dh^{10} + Eh^{12} + Fh^{14} + Gh^{16} + Hh^{18} + Jh^{20}$$

In the above formula, c is the apex curvature while k is the conical coefficient (K) according to Code V®.

Figure 2:
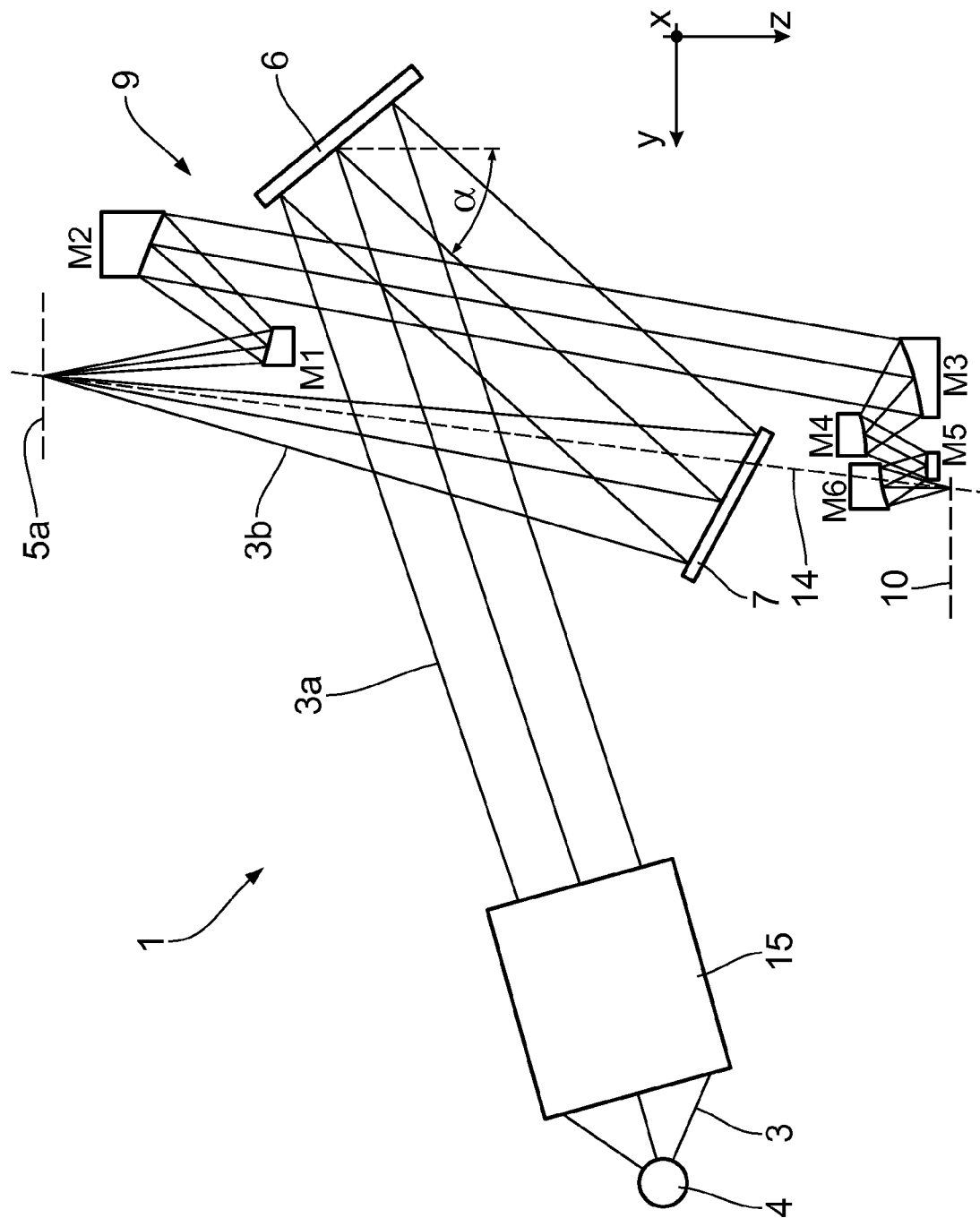
FIGS. 2 to 4 show bundle-guiding components of microlithographic EUV projection exposure apparatuses that include an illumination system and a projection objective.
Figure 3:
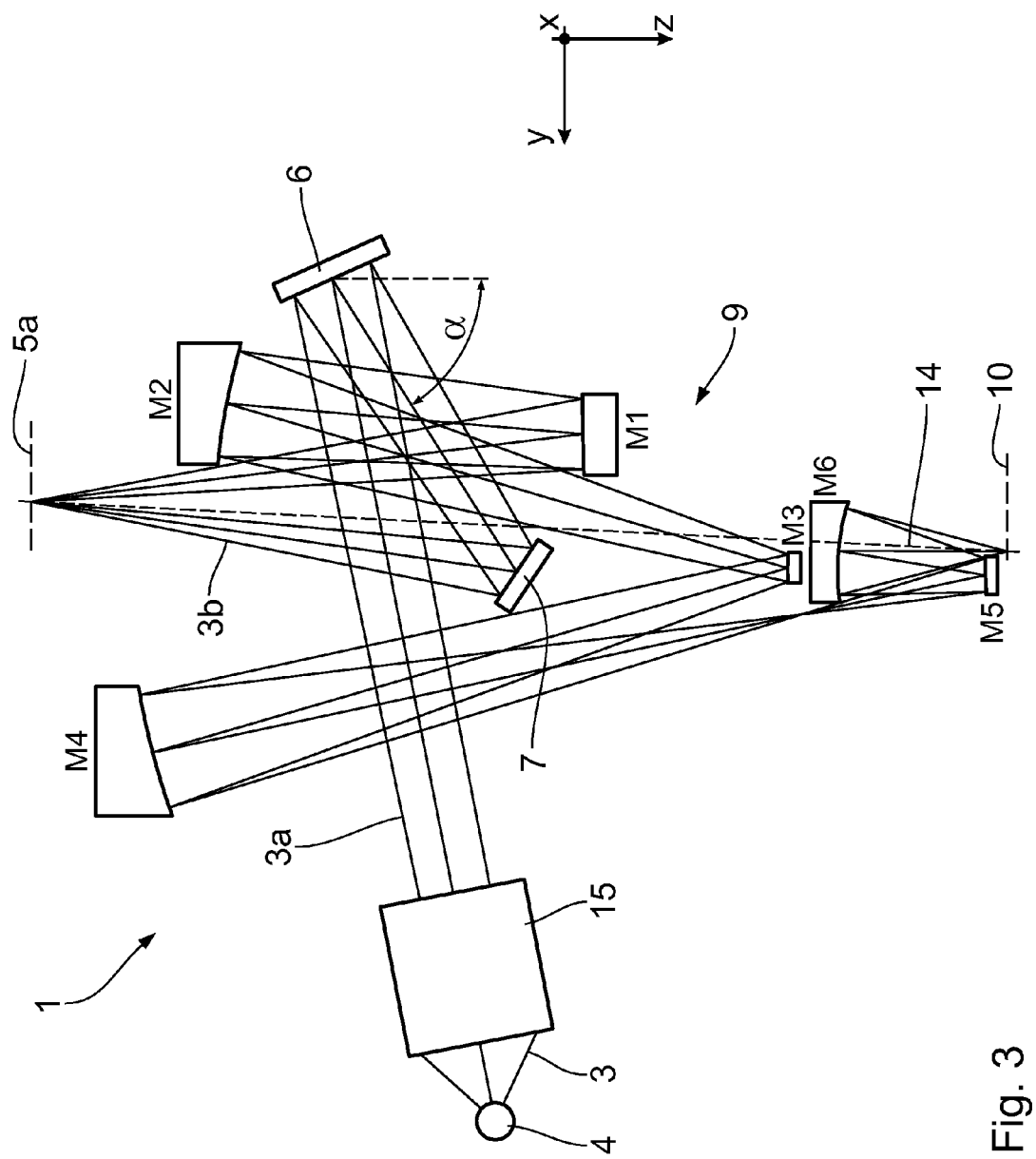
Figure 4:
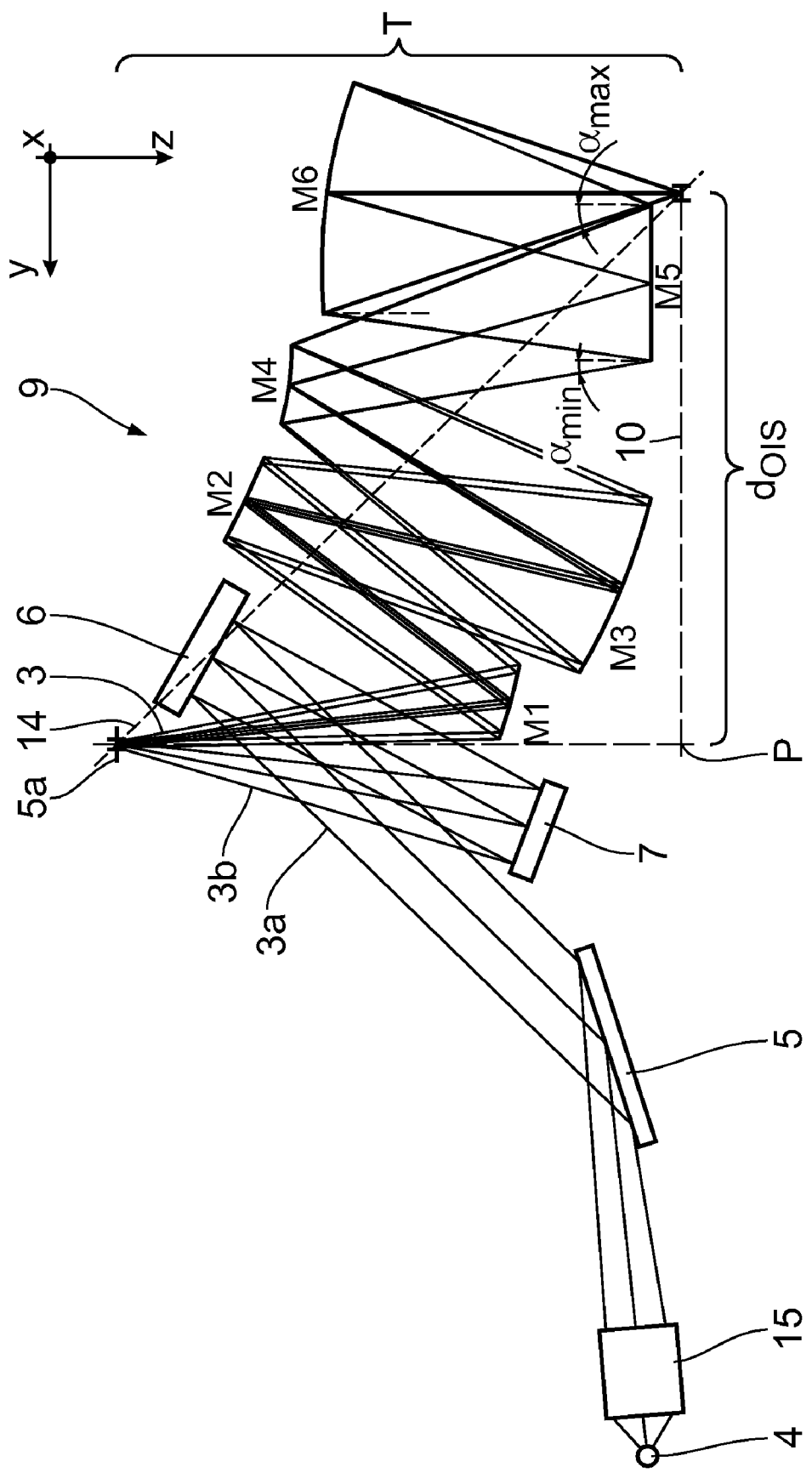

Certain bundle-guiding arrangements are described by FIGS. 2 to 4. Components that are equivalent to those as described above in relation to FIG. 1 are referred to with the same reference numerals and are not described again.

The projection objective 9 in FIG. 2 used to image the object field of the projection exposure apparatus 1 according to FIG. 2 into the image plane is already described in US 2007/0223112 by FIG. 2a displayed therein. A detailed description thereof is therefore not necessary. The projection objective 9 according to FIG. 2 has a total of six mirrors which are referred to by M1 to M6 in the order of the beam path of the illumination light 3.

In FIG. 2 the EUV illumination light 3 is generated by the radiation source 4 and focused by a collector 15. The field facet mirror 6 is disposed downstream of the collector 15, a pupil facet mirror 7 being disposed downstream of the field facet mirror 6. The illumination light 3 moves between the collector 15 and the field facet mirror 6 at an angle of approximately 20° relative to the y-axis. According to FIG. 1, the field facet mirror 6 and the radiation source 4 are disposed in different half-spaces defined by the separation plane 14. The pupil facet mirror 7 is disposed in the half-space of the radiation source 4. Between the field facet mirror 6 and the pupil facet mirror 7, the illumination light 3 has a chief-ray direction that forms an angle a of approximately 40° with the z-axis.

Seen in the z-direction, the field facet mirror 6 is spaced from the object plane 5a by approximately the same distance as the mirror M1. The pupil facet mirror 7 is spaced from the image plane 10 by approximately twice the distance as the two mirrors M4 and M6. The projection objective 9 in FIG. 3 that is used to image the object field of the projection exposure apparatus 1 according to FIG. 3 into the image field is already described in US 2007/0223112 by FIG. 6b displayed therein. A detailed description thereof is therefore not necessary.

In FIG. 3 the illumination light 3 forms an angle of approximately 10° with the y-axis. As in FIG. 1, the field facet mirror 6 and the radiation source 4 are disposed in different half-spaces defined by the separation plane 14. The pupil facet mirror 7 is disposed in the half-space of the radiation source 4. Between the field facet mirror 6 and the pupil facet mirror 7, the illumination light 3 has a chief-ray direction that forms an angle a of approximately 55° with the z-axis.

The projection objective 9 according to FIG. 3 has a total of six mirrors which are referred to by M1 to M6 in the order of the beam path of the illumination light 3.

FIG. 4 shows another alternative of guiding illumination light 3. The projection objective 9 in FIG. 4 is hereinafter also referred to as projection optics. The projection optics 9 has a numerical aperture of 0.32 on the image side. The overall length T of the projection optics 9 amounts to 1000 mm. The object-image shift $d_{OIS}$ amounts to 978 mm in the projection optics 15. The $T/d_{OIS}$ ratio thus amounts to approximately 1.02.

In the projection optics 9, the maximum incidence angle range also occurs at mirror M5, amounting to 13°. The minimum angle of incidence occurs at the left-hand edge of mirror M5 according to FIG. 4 and amounts to approximately 9°. The maximum angle of incidence occurs at the right-hand edge of mirror M5 according to FIG. 4 and amounts to approximately 22°. Likewise, the image plane 10 is the first field plane downstream of the object plane 5a in the projection optics 9.

Likewise, at least one of the mirrors M1 to M6 is a biconical freeform reflection surface in the projection optics 9.

At least one of the mirrors M1 to M6 has a reflection surface that is a biconical freeform reflection surface which may be described by the following formula:

$$z = \frac{cvx \cdot x^2 + cvy \cdot y^2}{1 + \sqrt{1 - cvx^2(ccx+1)x^2 - cvy^2(ccy+1)y^2}} + \sum_{i=0}^{n}\sum_{j=0}^{i} a_{j,i-j} x^j y^{i-j}$$

In this formula, x and y denote the coordinates on the reflection surface in relation to a coordinate origin which is defined as the point of penetration of a normal through the reflection surface. In theory, this point of penetration may also be located beyond the used reflection surface.

z denotes the sag of the freeform reflection surface. The coefficients cvx and cvy describe the curvatures of the freeform reflection surfaces along an xz- and a yz-section. The coefficients ccx and ccy are conical parameters.

The freeform surface formula includes a leading biconical term and a subsequent xy-polynominal with a coefficient $a_{ji}$.

The following tables specify arrangement and shape of the optical surfaces of the mirrors M1 to M6 within the projection optics 9.

In the first column, table 1 defines numbers for selected surfaces. The second column specifies the distance of the respective surface from the surface preceding the former in the z-direction. The third column of table 1 specifies a y-deviation of the local coordinate system of the respective surface in relation to a global coordinate system.

The last column of table 1 enables the defined surfaces to be assigned to the components of the projection optics 9.

TABLE 1

| Surface | Distance from preceding surface | y-deviation | |
|---|---|---|---|
| 0 | 0.000000 | 0.000000 | Image plane |
| 1 | 726.023335 | 0.000000 | |
| 2 | −577.595015 | −192.238869 | M6 |
| 3 | 745.417411 | −192.777551 | M5 |
| 4 | −738.103985 | −192.462469 | M4 |
| 5 | 994.730526 | −243.767917 | M3 |
| 6 | −450.919688 | −164.949143 | M2 |
| 7 | 885.694809 | −165.918838 | M1 |
| 8 | 0.000000 | −1114.493643 | Object plane |

Table 2 contains the data regarding the respective freeform reflection surfaces of the mirrors M6 (surface 2), M5 (surface 3), M4 (surface 4), M3 (surface 5), M2 (surface 6) M1 (surface 7). Coefficients which are not specified are equal to zero. Moreover, the following applies: RDX=1/cvx; RDY=1/cvy.

TABLE 2

Freeform data

Surface 2
RDY −1172.300000
RDX −1295.000000
CCY 0.787469
CCX 1.053600

| j | i − j | $a_{j,i-j}$ |
|---|---|---|
| 0 | 1 | −7.219074E−04 |
| 2 | 0 | −3.578974E−05 |
| 0 | 2 | −2.128273E−05 |
| 2 | 1 | 7.097815E−10 |
| 0 | 3 | −1.618913E−09 |
| 4 | 0 | −2.252005E−12 |

TABLE 2-continued

Freeform data

| 2 | 2 | −3.895991E−12 |
|---|---|---|
| 0 | 4 | 2.750606E−13 |
| 4 | 1 | −4.464498E−15 |
| 2 | 3 | −4.637860E−16 |
| 0 | 5 | −6.920120E−16 |
| 6 | 0 | −3.637297E−18 |
| 4 | 2 | 2.537830E−18 |
| 2 | 4 | 1.002850E−17 |
| 0 | 6 | −3.044197E−18 |

Surface 3
RDY −1236.400000
RDX −1536.200000
CCY 2.551177
CCX 4.047183

| j | i − j | $a_{j,i-j}$ |
|---|---|---|
| 0 | 1 | −6.558677E−03 |
| 2 | 0 | 3.540129E−04 |
| 0 | 2 | 4.133618E−04 |
| 2 | 1 | −1.904320E−08 |
| 0 | 3 | −3.576692E−08 |
| 4 | 0 | 1.496417E−12 |
| 2 | 2 | 1.864663E−11 |
| 0 | 4 | 3.000005E−12 |
| 4 | 1 | −7.105811E−15 |
| 2 | 3 | 5.293727E−14 |
| 0 | 5 | −1.509974E−14 |
| 6 | 0 | 2.907360E−18 |
| 4 | 2 | 5.694619E−17 |
| 2 | 4 | 8.177232E−17 |
| 0 | 6 | 4.847943E−18 |

Surface 4
RDY 2267.500000
RDX 1709.200000
CCY 13.716154
CCX 2.188445

| j | i − j | $a_{j,i-j}$ |
|---|---|---|
| 0 | 1 | 2.536301E−01 |
| 2 | 0 | 1.786226E−04 |
| 0 | 2 | 4.303983E−04 |
| 2 | 1 | −5.494928E−10 |
| 0 | 3 | 4.116436E−09 |
| 4 | 0 | −2.775915E−11 |
| 2 | 2 | 3.269596E−11 |
| 0 | 4 | 3.121929E−12 |
| 4 | 1 | 2.286620E−14 |
| 2 | 3 | 1.431437E−14 |
| 0 | 5 | −8.016660E−15 |
| 6 | 0 | −8.966865E−17 |
| 4 | 2 | 3.631639E−16 |
| 2 | 4 | −3.150250E−16 |
| 0 | 6 | −7.235944E−18 |

Surface 5
RDY 1453.100000
RDX 1691.600000
CCY 0.004158
CCX 0.130787

| j | i − j | $a_{j,i-j}$ |
|---|---|---|
| 0 | 1 | 1.413720E−02 |
| 2 | 0 | 1.853431E−05 |
| 0 | 2 | 8.632041E−07 |
| 2 | 1 | 2.471907E−09 |
| 0 | 3 | 1.031600E−08 |
| 4 | 0 | 1.594814E−12 |
| 2 | 2 | 1.271047E−13 |
| 0 | 4 | −8.477699E−14 |
| 4 | 1 | 1.841514E−15 |
| 2 | 3 | 1.063273E−15 |
| 0 | 5 | −3.890516E−16 |
| 6 | 0 | −7.937130E−19 |

TABLE 2-continued

Freeform data

| 4 | 2 | 4.923627E−18 |
|---|---|---|
| 2 | 4 | −3.489821E−18 |
| 0 | 6 | −3.625541E−18 |

Surface 6
RDY −3061.000000
RDX −3961.700000
CCY 0.069638
CCX 0.416068

| j | i − j | $a_{j, i-jj}$ |
|---|---|---|
| 0 | 1 | −1.950186E−01 |
| 2 | 0 | 4.908498E−04 |
| 0 | 2 | 5.948960E−04 |
| 2 | 1 | −2.711540E−08 |
| 0 | 3 | 1.073427E−08 |
| 4 | 0 | −3.053221E−12 |
| 2 | 2 | −5.601149E−12 |
| 0 | 4 | 4.072326E−13 |
| 4 | 1 | −3.675214E−13 |
| 2 | 3 | 3.165916E−14 |
| 0 | 5 | −1.649353E−15 |
| 6 | 0 | −8.908751E−17 |
| 4 | 2 | −2.427088E−16 |
| 2 | 4 | 2.643106E−16 |
| 0 | 6 | −7.400900E−18 |

Surface 7
RDY 210.148013
RDX 383.382688
CCY −1.001702
CCX −0.999069

| j | i − j | $a_{j, i-j}$ |
|---|---|---|
| 0 | 1 | −2.506963E−04 |
| 2 | 0 | −1.093695E−03 |
| 0 | 2 | −2.285463E−03 |
| 2 | 1 | −7.246135E−09 |
| 0 | 3 | −1.030905E−07 |
| 4 | 0 | −7.535621E−11 |
| 2 | 2 | −4.600461E−12 |
| 0 | 4 | −9.217052E−14 |
| 4 | 1 | −2.057821E−13 |
| 2 | 3 | 2.433632E−16 |
| 0 | 5 | 1.627316E−16 |
| 6 | 0 | −1.969282E−17 |
| 4 | 2 | −1.033559E−16 |
| 2 | 4 | 2.086873E−17 |
| 0 | 6 | 1.058816E−18 |

Fabrication of a microstructured component via the projection exposure apparatus 1 initially involves provision of the reflection mask, i.e. the reticle 8, and of the substrate, i.e. the wafer 11. Subsequently, a structure on the reflection mask is imaged onto a light-sensitive layer on the wafer 11 via the projection optics 9 of the projection exposure apparatus 1. The light-sensitive layer is then developed to create a microstructure on the wafer 11 which is in turn developed into the microstructured component.

What is claimed is:

1. An illumination system configured to guide radiation to an object plane to illuminate an object field in the object plane, the illumination system comprising:
   a first bundle-guiding component disposed in a pupil plane of a projection objective, the first bundle-guiding component being configured to supply radiation to the object field; and
   a second bundle-guiding component upstream of the first bundle-guiding component along a path of the radiation in the illumination system,
   wherein the first and second bundle-guiding components are configured so that the path of the radiation impinging on the second bundle-guiding component intersects the path of the radiation between the first bundle-guiding component and the object field.

2. An illumination system according to claim 1, wherein the second bundle-guiding component is disposed such that the radiation is supplied directly to the object field from the pupil component.

3. An illumination system according to claim 1, wherein a mirror is disposed between the first bundle-guiding component and the object field so that the radiation impinges on the mirror at an angle of incidence that is greater than or equal to 60°.

4. An apparatus, comprising:
   illumination system; and
   a projection objective configured to image an object field in an object plane into an image field in an image plane,
   wherein:
   (i) the illumination system comprises:
      a first bundle-guiding component configured to supply radiation to the object field in the object plane, the first bundle-guiding component is disposed in a pupil plane of a projection objective; and
      a second bundle-guiding component upstream of the first bundle-guiding component along a path of the radiation in the apparatus;
   (ii) viewed from a source of the radiation, the second bundle-guiding component is beyond an optical axis of the projection objective;
   (iii) centers of curvature of optically active surfaces of the projection objective are along the optical axis of the projection objective; and
   (iv) the apparatus is a microlithographic projection exposure apparatus; and
   (v) the first and second bundle-guiding components are configured so that the path of the radiation impinging on the second bundle-guiding component intersects the path of the radiation between the first bundle-guiding component and the object field.

5. An apparatus according to claim 4, wherein viewed from a source of the radiation, the second bundle-guiding component lies beyond a plane which:
   is perpendicular to a radiation main plane defined by the first and second bundle-guiding components for the radiation upstream of the first bundle-guiding component; and
   contains a connection line between points of penetration of central chief rays of the illumination light through a reticle in the object plane on the one hand and through a wafer in the image plane on the other.

6. An apparatus according to claim 4, wherein no optical component of the projection objective is disposed along the optical axis at least along a free length of more than 40% of the length of the projection objective.

7. An apparatus according to claim 4, wherein the optical component closest to the optical axis along the free length of the optical axis is spaced from the optical axis by a distance of more than 10% of the free length.

8. An apparatus according to claim 4, wherein the projection objective comprises six mirrors between the object plane and the image plane, and the fourth mirror along the path of the radiation is convex.

9. An apparatus according to claim 4, wherein the projection objective comprises six mirrors between the object plane and the image plane, and the third mirror along the radiation path is concave.

10. An apparatus according to claim 4, further comprising a coupling mirror upstream of the first bundle-guiding component along the path of the radiation, wherein the coupling mirror is also a spectral filter for the radiation.

11. A method, comprising:
using the apparatus of claim 4 to fabricate a component.

12. The method of claim 11, further comprising:
providing a reticle having a pattern; and
imaging the pattern of the reticle onto a light-sensitive layer of a wafer to provide the component.

13. An apparatus, comprising:
an illumination system; and
a projection objective configured to image an object field in an object plane into an image field in an image plane, wherein:
  (i) the illumination system, comprises:
    a first bundle-guiding component disposed in a pupil plane of the projection objective, the first bundle-guiding component being configured to supply radiation to the object field; and
    a second bundle-guiding component upstream of the first bundle-guiding component along a path of the radiation in the apparatus;
  (ii) the first and second bundle-guiding components are configured so that the path of the radiation impinging on the second bundle-guiding component intersects the path of the radiation between the first bundle-guiding component and the object field; and
  (iii) the apparatus is a microlithographic projection exposure apparatus.

14. An apparatus according to claim 13, wherein no optical component of the projection objective is disposed along the optical axis at least along a free length of more than 40% of the length of the projection objective.

15. An apparatus according to claim 13, wherein the optical component closest to the optical axis along the free length of the optical axis is spaced from the optical axis by a distance of more than 10% of the free length.

16. An apparatus according to claim 13, wherein the projection objective comprises six mirrors between the object plane and the image plane, and the fourth mirror along the path of the radiation is convex.

17. An apparatus according to claim 13, wherein the projection objective comprises six mirrors between the object plane and the image plane, and the third mirror along the radiation path is concave.

18. An apparatus according to claim 13, further comprising a coupling mirror upstream of the first bundle-guiding component along the path of the radiation, wherein the coupling mirror is also a spectral filter for the radiation.

19. A method, comprising:
using the apparatus of claim 13 to fabricate a component.

20. The method of claim 19, further comprising:
providing a reticle having a pattern; and
imaging the pattern of the reticle onto a light-sensitive layer of a wafer to provide the component.

* * * * *

UNITED STATES PATENT AND TRADEMARK OFFICE
CERTIFICATE OF CORRECTION

| | |
|---|---|
| PATENT NO. | : 7,999,917 B2 |
| APPLICATION NO. | : 12/171596 |
| DATED | : August 16, 2011 |
| INVENTOR(S) | : Zellner |

It is certified that error appears in the above-identified patent and that said Letters Patent is hereby corrected as shown below:

Column 9,
Line 48, After "6)" insert --and--

Signed and Sealed this
Eleventh Day of October, 2011

David J. Kappos
*Director of the United States Patent and Trademark Office*